(12) United States Patent
Cai

(10) Patent No.: US 7,220,646 B2
(45) Date of Patent: May 22, 2007

(54) INTEGRATED CIRCUIT STRUCTURE WITH IMPROVED LDMOS DESIGN

(75) Inventor: Jun Cai, Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 77 days.

(21) Appl. No.: 11/069,900

(22) Filed: Mar. 1, 2005

(65) Prior Publication Data
US 2005/0239253 A1   Oct. 27, 2005

Related U.S. Application Data

(62) Division of application No. 10/315,517, filed on Dec. 10, 2005, now Pat. No. 6,870,218.

(51) Int. Cl.
*H01L 21/336* (2006.01)
(52) U.S. Cl. .............. 438/286; 438/305; 438/307; 257/335
(58) Field of Classification Search ........... 438/286, 438/301, 305–307; 257/335, E21.417, E29.256
See application file for complete search history.

(56) References Cited

U.S. PATENT DOCUMENTS

| 5,079,608 A | 1/1992 | Wodarczyk et al. |
| 5,216,275 A | 6/1993 | Chen |
| 5,272,098 A * | 12/1993 | Smayling et al. ........... 438/268 |
| 5,567,634 A | 10/1996 | Hebert et al. |
| 5,585,294 A * | 12/1996 | Smayling et al. ........... 438/307 |
| 5,684,319 A | 11/1997 | Hebert |
| 5,792,687 A | 8/1998 | Jeng et al. |
| 5,852,314 A * | 12/1998 | Depetro et al. ............. 257/343 |
| 5,854,099 A | 12/1998 | Farrenkopf |
| 5,879,968 A | 3/1999 | Kinzer |

(Continued)

FOREIGN PATENT DOCUMENTS

EP    0 747 966 A2    12/1996

OTHER PUBLICATIONS

A. Moscatelli, A. Merlini, G. Croce, P> Galbiati, and C. Contiero, LDMOS Implementation in a 0.35 m BCD Technology (BCD6), ISPSD'2000 Copyright 2000 by theIEEE. Catalog No. 00CH37094C, STicroelectronics, TPA Group, Cornaredo (Milano), Italy.

(Continued)

*Primary Examiner*—M. Wilczewski
*Assistant Examiner*—Toniae M. Thomas
(74) *Attorney, Agent, or Firm*—Thomas R. FitzGerald, Esq.; Hiscock & Barclay, LLP

(57) ABSTRACT

A semiconductor integrated circuit including an LDMOS device structure comprises a semiconductor layer with a pair of spaced-apart field effect gate structures over an upper surface of the semiconductor layer. First and second spaced-apart source regions of a first conductivity type are formed in a portion of the layer between the pair of gate structures with a first region of a second conductivity type formed there between. A lightly doped body region of a second conductivity type is formed in the semiconductor layer, extending from below the source regions to below the gate structures and extending a variable depth into the semiconductor layer. This body region is characterized by an inflection in depth in that portion of the body region extending below the first region.

6 Claims, 6 Drawing Sheets

U.S. PATENT DOCUMENTS

| | | | |
|---|---|---|---|
| 5,891,776 | A | 4/1999 | Han et al. |
| 5,907,169 | A | 5/1999 | Hshieh et al. |
| 5,930,630 | A | 7/1999 | Hshieh et al. |
| 5,960,275 | A | 9/1999 | So et al. |
| 5,970,329 | A * | 10/1999 | Cha .................. 438/197 |
| 6,025,237 | A * | 2/2000 | Choi .................. 438/301 |
| 6,049,104 | A | 4/2000 | Hshieh et al. |
| 6,093,588 | A * | 7/2000 | De Petro et al. ........ 438/180 |
| 6,114,207 | A | 9/2000 | Okabe et al. |
| 6,198,127 | B1 | 3/2001 | Kocon |
| 6,252,278 | B1 | 6/2001 | Hsing |
| 6,264,167 | B1 | 7/2001 | Hamazawa |
| 6,268,626 | B1 * | 7/2001 | Jeon .................. 257/335 |
| 6,277,695 | B1 | 8/2001 | Williams et al. |
| 6,365,932 | B1 | 4/2002 | Kouno et al. |
| 6,376,878 | B1 | 4/2002 | Kocon |
| 6,661,042 | B2 | 12/2003 | Hsu |
| 6,870,218 | B2 * | 3/2005 | Cai .................. 257/335 |
| 2002/0195654 | A1 * | 12/2002 | Kwon .................. 257/329 |
| 2003/0040159 | A1 * | 2/2003 | Sasaki .................. 438/286 |
| 2004/0108548 | A1 * | 6/2004 | Cai .................. 257/335 |

OTHER PUBLICATIONS

V. Parthasarathy, R. Zhu, M.L. Ger, V. Khemka, A. Bose, R. Baird, T. Roggenbauer, D. Collins, S.Change, P. Hui and M. Zunino, A 0.35 m CMOS Based Smart Power Technology for 7v-50v Applications, ISPSD'2000 Copyrihht 2000 by the IEEE, Catalog No. 00CH37094C, Smart MOS Technology Ctr, Mesa, AZ 85202.

* cited by examiner

STANDARD DESIGN

INTEGRATED CIRCUIT STRUCTURE WITH IMPROVED LDMOS DESIGN

CROSS REFERENCE TO RELATED APPLICATIONS

This is a divisional application of U.S. patent application Ser. No. 10/315,517 filed Dec. 10, 2005, now U.S. Pat. No. 6,870,218.

FIELD OF THE INVENTION

This invention relates to semiconductor circuitry and, more particularly, to circuitry which integrates digital and power functions and methods for fabricating such devices.

BACKGROUND

The level of device integration continues to rise and the performance requirements of power devices on integrated circuitry continue to be more demanding. As digital circuit components become more compact it is desirable to reduce overall size of lateral power devices. However, as feature sizes shrink it is difficult to maintain voltage operating ranges and tolerance to reverse bias conditions.

These issues are especially relevant to the consumer portable electronic market. Performance demands require a growing array of peripheral functions, most commonly including display drivers, RF interfacing, and battery operation. To meet ever increasing consumer demands the portable designs must perform energy management and power conversion functions with increased efficiency.

Power integrated circuitry such as used in portable power supplies typically incorporates high voltage transistors with low voltage circuitry to efficiently manage battery usage and energy conversion. Due to performance requirements of the power device (e.g., fast switching speed, low "on" resistance and low power consumption during switching operations) the power device of choice for many power integrated circuits is the Lateral Double Diffused MOS transistor (LDMOS). When compared to bipolar transistor devices the LDMOS can provide relatively low on-resistance and high breakdown voltage. However, with the drive to further reduce device sizes and improve operational efficiencies, there remain limited means for sustaining or improving these device characteristics.

Further reductions in on-resistance could be achieved by increasing the dopant level in the LDMOS conductivity path, e.g., the drift region, or by reducing the length of the drift region, but such approaches have trade-offs impacting other aspects of device performance. For example, the lower resistances which would be achievable with higher dopant concentrations can degrade device breakdown voltage characteristics. Reductions in the length of the drift region can result in higher field concentrations near the gate and also lead to lower breakdown voltages.

Because the consumer market of today demands integrated circuitry having the combination of increased device density and lower power consumption, e.g., to both extend battery life and reduce overall cost, the progression to finer line geometries presents a challenge to develop techniques to design around inherent limitations in device on-resistance and breakdown voltages. Generally, it is a desire in the art to improve the safe operating area of such devices while reducing power dissipation.

SUMMARY OF THE INVENTION

According to the invention, a semiconductor device includes a semiconductor layer with a pair of spaced-apart field effect gate structures on a surface of the semiconductor layer. Each gate structure includes a first end portion facing the other gate structure. First and second spaced-apart source regions of a first conductivity type are formed in a portion of the layer between the pair of gate structures. The portion of the surface between the first end portions is characterized by a first area dimension. Each source region is self-aligned with respect to one of the first end portions. A lightly doped body region of a second conductivity type is formed in the semiconductor layer and extends from below the source regions to below the gate structures. A more heavily doped region of the second conductivity type extends into the portion of the surface between the first end portions, the region having an area dimension along the surface less than the first area dimension.

Also provided is a semiconductor integrated circuit including an LDMOS device structure comprising a semiconductor layer with a pair of spaced-apart field effect gate structures over an upper surface of the semiconductor layer. First and second spaced-apart source regions of a first conductivity type are formed in a portion of the layer between the pair of gate structures with a first region of a second conductivity type formed there between. A lightly doped body region of a second conductivity type is formed in the semiconductor layer, extending from below the source regions to below the gate structures and extending a variable depth into the semiconductor layer. This body region is characterized by an inflection in depth in that portion of the body region extending below the first region.

According to the invention a method of forming a semiconductor device includes forming with a first mask level a pair of spaced-apart field effect gate structures on a surface of a semiconductor layer. Each gate structure includes a first end portion facing the other gate structure. With a second mask level first and second spaced-apart source regions of a first conductivity type are formed in the layer and between the pair of gate structures with a resulting region of the surface between the first and second spaced-apart source regions having a first area dimension. A lightly doped body region of a second conductivity type, also defined with the second mask level, is formed in the semiconductor layer, extending below the source regions. A more heavily doped region of the second conductivity type is formed in a portion of the semiconductor layer having a surface with the first area dimension. The portion corresponding to the more heavily doped region has a surface with an area dimension smaller than the first area dimension.

BRIEF DESCRIPTION OF DRAWINGS

The invention will be more fully understood when the following detailed description is read in conjunction with the drawings wherein.

Figure 1:
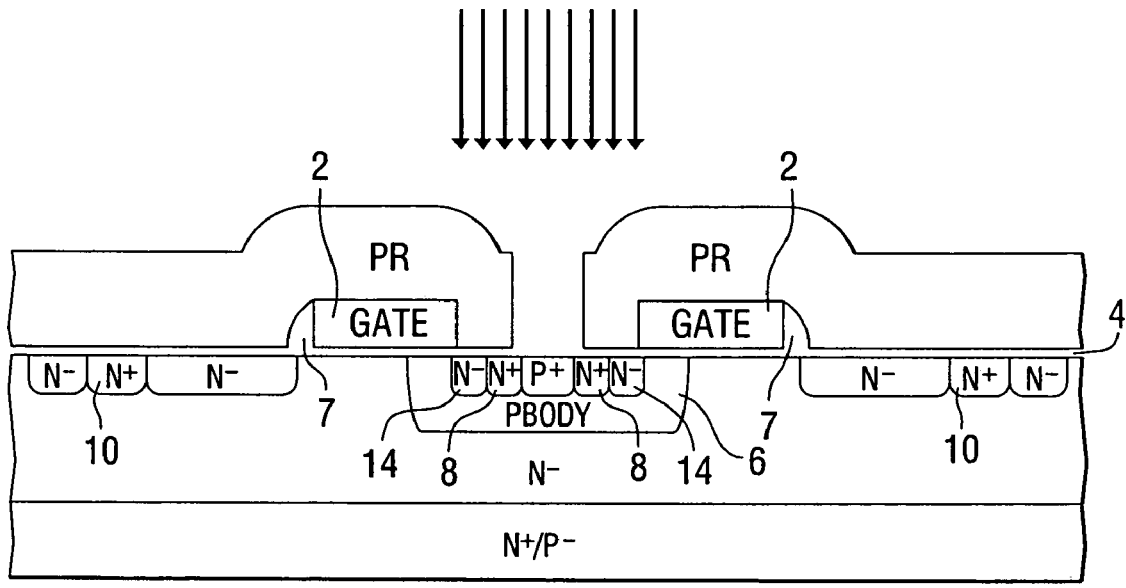
FIG. 1 is a partial view of a prior art semiconductor device.

In accord with common practice the various illustrated features in the drawings are not to scale, but are drawn to emphasize specific features relevant to the invention. Moreover, the sizes of features and the thicknesses of layers may depart substantially from the scale with which these are shown. Reference characters denote like elements throughout the figures and the text.

DETAILED DESCRIPTION OF THE INVENTION

In the following descriptions the dimensions provided are with reference to distances taken along the corresponding view. In a cross sectional view, a width or lateral dimension is intended to mean a distance along a horizontal dimension of the view, while a height or depth is intended to mean a distance taken along a vertical dimension of the view. For purposes of comparing example embodiments of the invention with prior-known designs, it may be assumed that all devices illustrated are fabricated with the same photolithographic capability. The disclosed embodiments assume a feature size, i.e., line width geometry, of 0.35 micron.

Reference to a dopant implantation or resulting diffusion there from as being self-aligned with respect to a feature or an associated structure means that the implantation or diffusion is one resulting from using that structure as a mask element such that, for example, implanted dopant, both before and after heat-activated diffusion, will exhibit a characteristic profile in relation to the structure or an associated feature. Although not specifically described herein, it will be understood that implanted dopants associated with the invention undergo various heat-activated diffusions during the fabrication process in order to acquire predictable post-diffusion profile characteristics. It is also to be understood that when a layer is been described or illustrated as positioned on or over another layer, there may be another intervening layer (not illustrated) associated with the same or an alternate embodiment of the invention.

A conventional prior art lateral device design, shown in FIG. 1, is formed in an N− upper layer of semiconductor material. The figure illustrates a pair of spaced-apart gate electrodes 2 each formed over a thermal oxide layer 4 and on the surface of the N− layer. Spacing between the gate electrodes is more than three microns. A P− type body 6 is formed by implantation through the surface of the N− layer and between the gate electrodes. Insulating sidewall spacer elements are formed on each side of each gate electrode 2. A pair of drain-side spacers 7 is illustrated. A pair of source spacers (not illustrated) is formed on facing sides of the different gate electrode 2 such that high dopant concentration source regions 8 are implanted in an offset relation to the gate electrodes 2.

Concurrent with the implant forming the source regions 8, N+ drains 10 are defined in spaced-apart relation to the gate electrodes 2 and through patterned photoresist openings. To lower the source resistance, the source spacers are typically removed (as illustrated) and a lower concentration N-type implant establishes lightly doped source extension regions 14 in self-alignment with the gate electrodes 2. At the same time, with the drain-side spacers 7 remaining, the N-type implant lowers the resistivity in a portion of each drift region, i.e., in the volume of the N-upper layer between each gate electrode 2 and an associated drain 10. This modification in material resistivity contributes to establishment of a greater uniformity in electric field across the drift region (i.e., the current path from gate to drain).

Figure 1A:
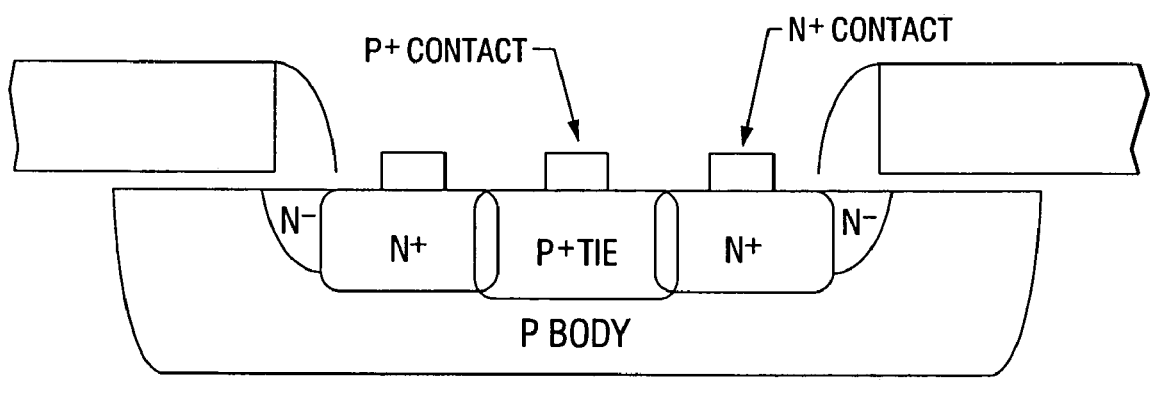
FIG. 1A is a further view of the contacts made to a prior art device.

The regions implanted into the device of FIG. 1 are later contacted by three separate contacts as shown in FIG. 1A. Note that the N+ source region is outside the limits of the sidewall spacers. In order to contact the two N+ source regions and the P+ body tie, the prior art device uses three separate contacts. Each contact area has a minimum dimension that is limited by the process parameters. The contact area for each contact has to be wide enough to provide for insulating material, such as silicon dioxide, that will isolate one contact form another. As such, the prior art device has at least three minimum contact areas between opposite sidewall spacers of its gates. The relatively large source contact areas add to the leakage and the p-body resistance underneath the N+ source area of the device.

The invention overcomes the disadvantages of the prior art by reducing the number of contact areas for the sources and body tie from three to one. This reduces the spacing between gate structures, reduces the size of the source regions and thereby reduces leakage and p-body resistance underneath. As a result, devices that use the invention have a larger safe operating area.

Fabrication of an LDMOS pair 20 according to one embodiment of the invention is shown in the partial cross sectional views of an integrated circuit structure 25 shown in FIGS. 2A–2F. The example sequentially illustrates relevant steps in an N-channel LDMOS based on a 0.35 micron line width geometry, beginning with a P− type semiconductor layer 30 having an upper surface 32 with a plurality of N-wells 34 formed in the upper surface. This illustration contemplates a CMOS integrated circuit having both N-channel and P-channel LDMOS devices formed along the surface 32, but for purposes of illustration only, fabrication of the pair of N-channel devices 20 is described in detail. Accordingly, it will be understood that while N-channel devices 20 are formed in N-wells, the complimentary P-channel devices are formed in the P-type region of the layer 30. The layer 30 may be epitaxially grown on an underlying substrate (not illustrated).

Figure 2A:
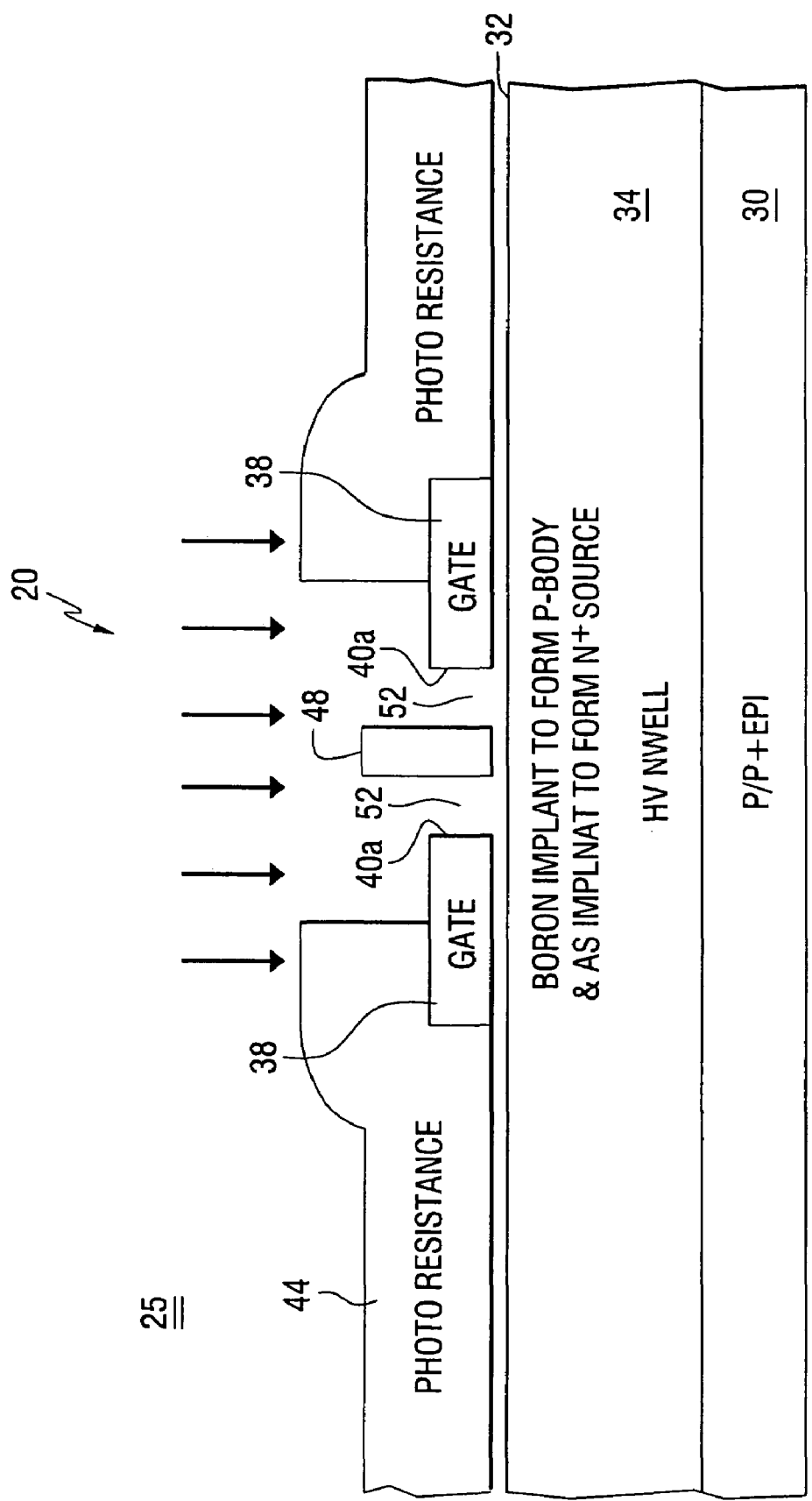
FIGS. 2A through 2E provide partial views, in cross section, of a semiconductor device in various stages of fabrication according to the invention.
Figure 2B:
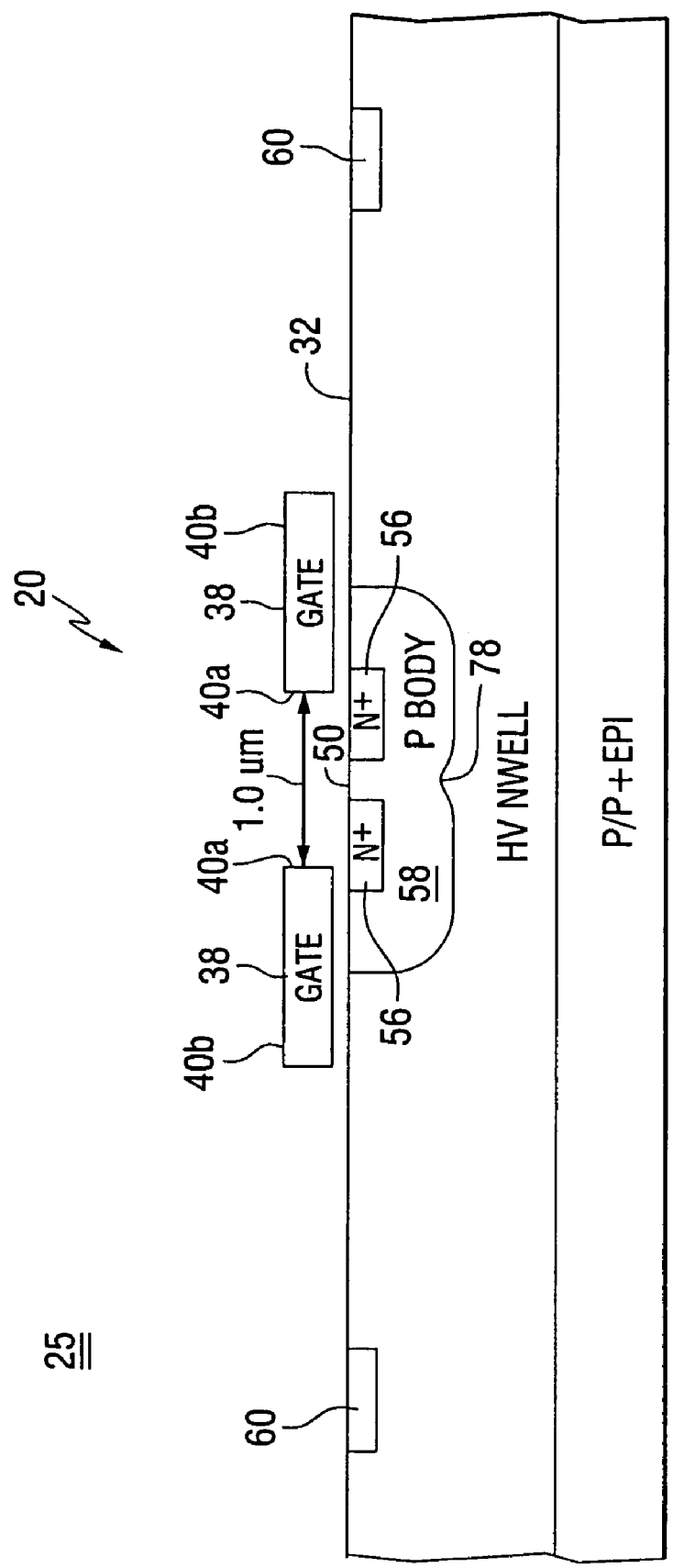

With the exemplary LDMOS pair 20 being formed in an N-type well 34, only a relevant portion of the associated N-well is shown in the figures. With reference to FIGS. 2A and 2B, a pair of spaced-apart gate electrodes 38 is conventionally formed on the surface 32. Each electrode 38 includes an end portion 40a which faces the other electrode 38, and each electrode further includes an end portion 40b which faces away from the other electrode 38. See FIG. 2B. A preferred width between the end portions 40a is about one micron.

An implant mask level of photoresist 44 is deposited and patterned over the surface 32 of the layer 30, with an element 48 spaced between the end portions 40a of the illustrated electrodes 38 to create two spaced-apart openings 52, each approximately 0.3 micron in width, suitable for receiving source implants. The resist element 48, preferably having a width on the order of 0.4 micron, is intended to isolate a sufficient region 50 of the surface 32 between the openings 52 from receiving implantation in order to assure separation of doped regions after lateral diffusion. With the photoresist 44 in place, a hetero-doping implant is performed to provide a shallow N-type source dopant along the surface 32 and a deeper P-type dopant within the N-well to form a body region. The photoresist 44 is then removed. See FIG. 2B, which illustrates formation of sources 56 and body region 58 after diffusion. Preferably, the source implant is on the order of $3 \times 10^{15}$ cm$^{-2}$ (Arsenic) at 30 KeV while the body region implant is on the order of $5 \times 10^{13}$ cm$^{-2}$ to $1 \times 10^{14}$ cm$^{-2}$ (Boron) at 60 KeV. Conventional N-type drains 60, formed with separate photomask and implant steps, are also illustrated. The drains 60 may be formed in conjunction with formation of other CMOS devices along other portions of the surface 32.

Figure 2C:
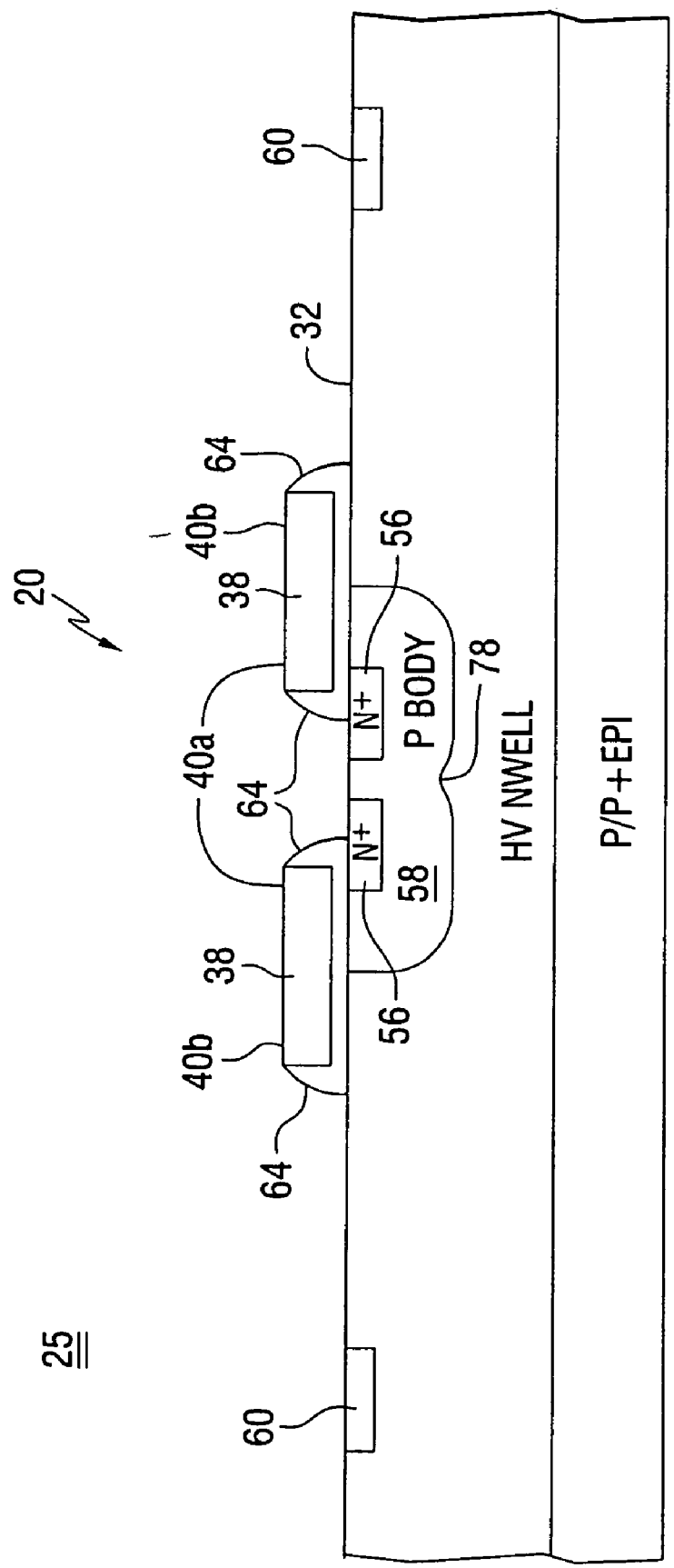

After the hetero-doping step to establish source and body region implants, sidewall spacer elements 64 are formed on the gate end portions 40a and may, as illustrated in FIG. 2C, also be formed on the gate end portions 40b. The spacer elements 64 may be formed by deposit of insulating material, such as a silicon oxide or silicon nitride, followed by an anisotropic etch.

With spacer elements 64 positioned against each gate end portion 40a, regions over the surface extending from the gate electrode end portions 40b to past the drains 60 are masked with patterned photoresist 66. See FIG. 2D wherein exposed portions of the surface 32 receive a P+ implant 68 on the order of $1\times10^{15}$ cm$^{-2}$ to $3\times10^{15}$cm$^{-2}$ (Boron or BF2) at 80 KeV to form a body tie 70. The body tie extends through the source regions and is self-aligned with the adjacent spacer elements 64. That is, the body tie is nested within the region underlying the surface 32 which is occupied by the sources. According to the invention this arrangement allows a lateral offset of the source implants with respect to the body tie implant such that the resulting sources 56 are offset with respect to the body tie 70. In the resulting structure (after diffusion) each source is in self-alignment with an adjacent gate end portion 40a while the body tie is in self-alignment with each adjacent spacer element 64. Preferably, the implant 68 is used to simultaneously form CMOS P+ source/drain diffusions for digital circuitry on the integrated circuit structure 25.

Figure 2D:
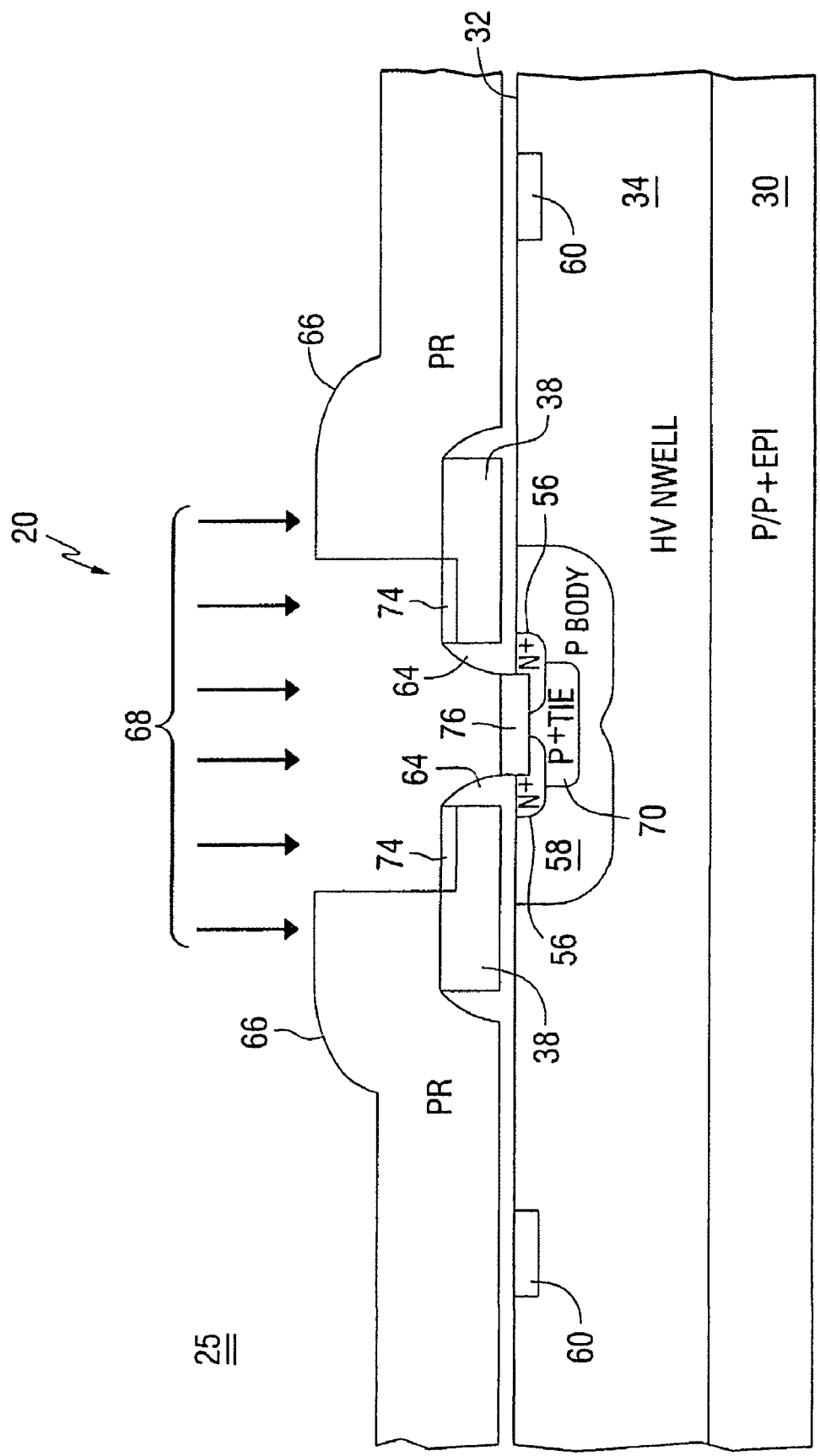
Figure 2E:
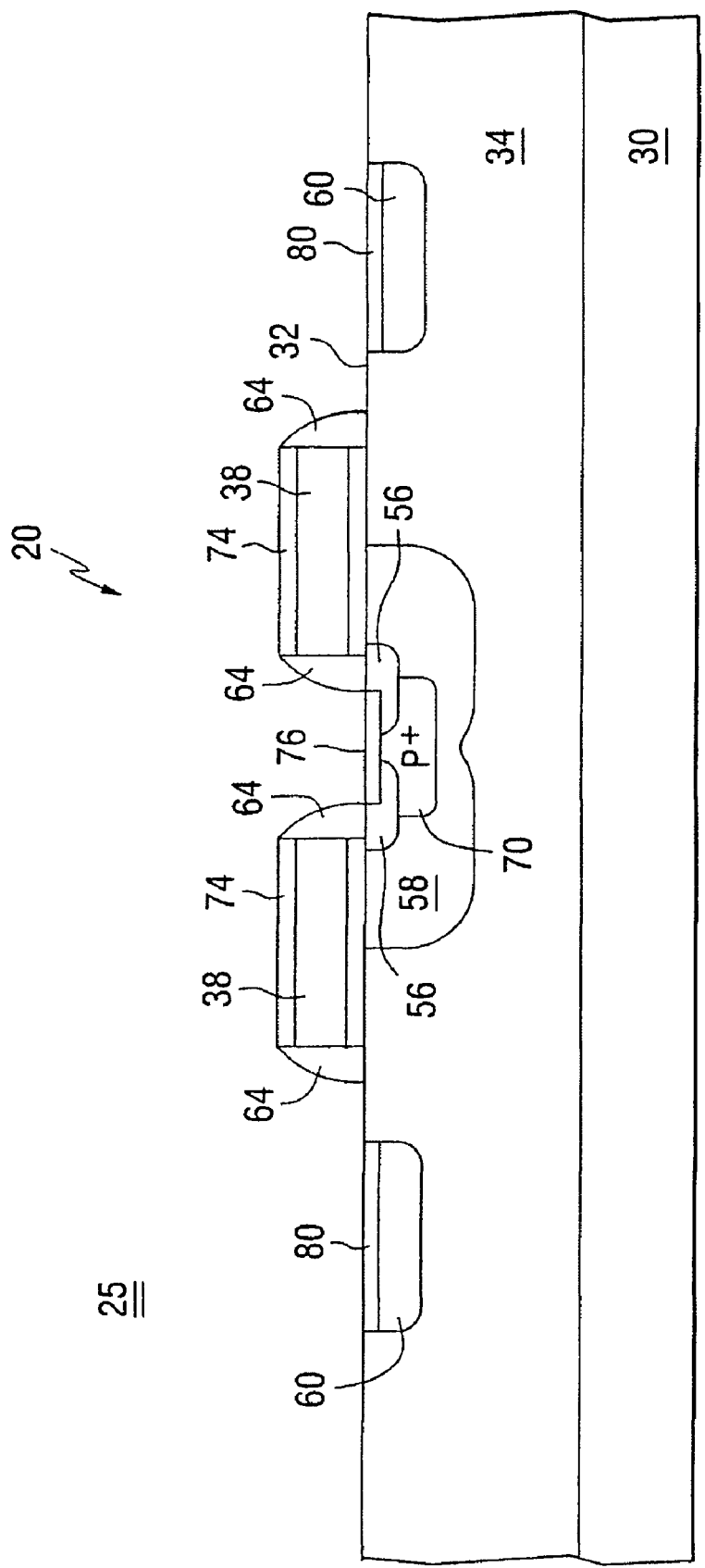

As shown in FIG. 2D the fully formed body tie 70 reaches into the semiconductor layer 30, i.e., into the well 34 and body 58, below the source regions 56. A feature of this structure is that a significant portion of each source 56 positioned beneath an overlying spacer element 64 retains a relatively heavy net dopant concentration while the nested body tie is also of low resistivity and small lateral dimension. After removal of the photoresist mask 66, metal such as tungsten, titanium or cobalt is deposited and reacted to form gate silicide 74 and source/body tie silicide 76. FIG. 2E illustrates the structure 25 after the silicidation process.

An improved LDMOS device has been described. The resulting device has improved on-resistance and safe operating area of operation. A feature of the invention is the heterodoping implant of FIGS. 2A and 2B which provides the source regions 56 and the body region 58 with one mask level, thus reducing the number of masks required to form an LDMOS having improved performance characteristics. Notably, the heterodoping feature results in the combination of spaced-apart source regions 56 about the region 50 and an inflection 76 in the depth of the portion of the body region under the region 50, both of these features being attributable to the presence of the mask element 48 during the heterodoping process. Thus, the depth of the body region into the semiconductor layer is relatively deep under the gate electrodes compared to the depth under the first region.

Another feature of the invention is the provision of source regions characterized by a relatively constant lateral dopant profile between the heavily doped region of the second conductivity type and the portion of the semiconductor layer underlying an adjacent gate structure, e.g., an electrode 38. That is, the source regions may be formed with a single dopant implant of the net conductivity type, whereas in the past the source structures have required a combination of heavily doped regions (e.g., regions 8 of FIG. 1) and more lightly doped regions (e.g., extension regions 14 of FIG. 1) to effect lower device on-resistance. The low specific on-resistance of devices constructed according to the invention results from the reduced device unit size, e.g., achievable with self-aligned formations such as illustrated in the figures. An improved safe operating area of operation results from reduced body resistance, small source space area, a shallow source junction and the retrograde doping profile of the body region, e.g., region 58.

To effect the small dimensions which facilitate improved operating performance, spacer elements, e.g., the spacers 64 adjacent the gate electrode end portions 40a and 40b, provide a fine line geometry mask to enable small source areas. In addition, the self-aligned salicidation (salicide) process enables low contact resistances due to no heavy dopant compensation in critical contact areas such as the body tie region and source regions. Both the body tie 70 and the associated salicide layer 76 are self-aligned with respect to the source regions 56. The invention recognizes that the N+ source implants do not have to be the same size and the drain implants.

The invention uses the sidewall oxide spacers on the gates to mask the N+ source implants from the P+ tie implant. With the invention, the N+ source implants are made before the sidewall spacers. The process of the invention uses one masking step for implanting the N+ sources and the P− body. The invention eliminates the separate P− body masking step required by the prior art. The invention provides a single, silicide contact that is self-aligned to the two N+ sources, the P+ body tie, and the overlap of the N+ sources and P+ body tie. The number of contacts are reduced from three (prior art) to one. The single contact between the gates provides a denser device and the device has a wider safe operating area because its small sources have less leakage and p-body resistance underneath than the larger sources of prior art devices.

An architecture and process have been described for an improved semiconductor device. Exemplary embodiments have been disclosed while other embodiments of the invention, including structures composed of different semiconductor, insulating and conductive materials will be apparent. Moreover, although the invention has been illustrated for one set of conductivity types, application of the invention is contemplated for opposite conductivity-type devices as well. Because the invention may be practiced in a variety of ways, the scope of the invention is only limited by the claims which now follow.

I claim:

1. A method of forming a semiconductor device comprising:
   providing a layer of semiconductor material;
   forming with a first mask level a pair of spaced-apart field effect gate structures on a surface of a semiconductor layer, each structure including a first end portion facing the other gate structure;
   forming with a second mask level first and second spaced-apart source regions of a first conductivity type in the layer and between the pair of gate structures with a resulting region of the surface between the first and second spaced-apart source regions having a first area dimension;
   also forming with the second mask level a lightly doped body region of a second conductivity type in the layer and extending below the source regions;
   forming a more heavily doped region of the second conductivity type in a portion of the semiconductor layer having a surface with the first area dimension, said portion having a surface with an area dimension smaller than the first area dimension; and
   forming, prior to forming the more heavily doped region, a sidewall spacer over each source region and against one of the first end portions.

2. The method of claim 1 wherein the source regions are formed with a single implantation step of the first conductivity type.

3. The method of claim 1 wherein each source region is formed in self-alignment with a different gate structure end portion.

4. The method of claim 3 wherein the source regions are formed in spaced-apart relation to one another by the positioning of a mask layer element over the portion of the surface of the semiconductor layer between the pair of source regions.

5. The method of claim 1 wherein the source regions each extend beneath a gate structure end portion.

6. The method of claim 1 further including forming the sidewall spacer against each of the first end portions and over each of the source regions prior to forming the more heavily doped region so that the more heavily doped region is formed in self-alignment with respect to the sidewall spacers.

* * * * *

UNITED STATES PATENT AND TRADEMARK OFFICE
CERTIFICATE OF CORRECTION

PATENT NO. : 7,220,646 B2
APPLICATION NO. : 11/069900
DATED : May 22, 2007
INVENTOR(S) : Jun Cai

It is certified that error appears in the above-identified patent and that said Letters Patent is hereby corrected as shown below:

On the Title Page, Item (62) change "Division of application No. 10/315,517, Filed on Dec. 10, 2005, now Pat. No. 6,870,218" to --Division of application No. 10/315,517, Filed on Dec. 10, 2002, now Pat. No. 6,870,218--

Signed and Sealed this

Fifteenth Day of July, 2008

JON W. DUDAS
*Director of the United States Patent and Trademark Office*